(12) United States Patent
McCallister et al.

(10) Patent No.: US 7,899,416 B2
(45) Date of Patent: Mar. 1, 2011

(54) RF TRANSMITTER WITH HEAT COMPENSATION AND METHOD THEREFOR

(75) Inventors: Ronald Duane McCallister, Scottsdale, AZ (US); Eric M. Brombaugh, Mesa, AZ (US)

(73) Assignee: Crestcom, Inc., Scottsdale, AZ (US)

( * ) Notice: Subject to any disclaimer, the term of this patent is extended or adjusted under 35 U.S.C. 154(b) by 647 days.

(21) Appl. No.: 11/939,890

(22) Filed: Nov. 14, 2007

(65) Prior Publication Data
US 2009/0124218 A1    May 14, 2009

(51) Int. Cl.
  *H04B 1/04*    (2006.01)
(52) U.S. Cl. ............ 455/114.3; 455/126; 330/149
(58) Field of Classification Search ........... 455/91, 455/114.1, 115.1, 115.2, 15.3, 117, 126, 455/127.1, 114.2, 114.3; 330/49, 51, 149, 330/279, 284
See application file for complete search history.

(56) References Cited

U.S. PATENT DOCUMENTS

| | | | |
|---|---|---|---|
| 4,019,150 A * | 4/1977 | Lurey et al. ............ 455/117 |
| 5,177,453 A * | 1/1993 | Russell et al. ............ 330/284 |
| 5,339,046 A | 8/1994 | Kornfeld et al. | |
| 5,598,127 A | 1/1997 | Abbiati | |
| 5,867,065 A | 2/1999 | Leyendecker | |
| 5,923,712 A | 7/1999 | Leyendecker et al. | |
| 5,959,500 A | 9/1999 | Garrido | |
| 6,011,415 A | 1/2000 | Hahn et al. | |
| 6,118,335 A | 9/2000 | Nielsen et al. | |
| 6,141,390 A | 10/2000 | Cova | |
| 6,282,247 B1 | 8/2001 | Shen | |
| 6,731,168 B2 | 5/2004 | Hedberg et al. | |
| 7,170,343 B2 | 1/2007 | Jin et al. | |
| 7,279,972 B2 | 10/2007 | Smithson | |
| 7,551,905 B2 * | 6/2009 | Kubo et al. ............ 455/126 |
| 2003/0006845 A1 | 1/2003 | Lopez et al. | |
| 2003/0146787 A1 | 8/2003 | Hedberg et al. | |
| 2004/0247042 A1 | 12/2004 | Sahlman | |
| 2005/0157814 A1 | 7/2005 | Cova et al. | |
| 2005/0163249 A1 | 7/2005 | McCallister | |
| 2005/0163252 A1 | 7/2005 | McCallister et al. | |
| 2005/0195919 A1 | 9/2005 | Cova | |
| 2005/0212598 A1 | 9/2005 | Lin et al. | |

(Continued)

OTHER PUBLICATIONS

International Search Report and Written Opinion regarding PCT/US2008/080485, dated Dec. 23, 2008.

(Continued)

*Primary Examiner*—Thanh C Le
(74) *Attorney, Agent, or Firm*—Meschkow & Gresham, P.L.C.

(57) ABSTRACT

An RF transmitter (10) includes an RF amplifier (22) that experiences gain-droop distortion as a result of self-heating. A heat compensator (20) is included to insert a gain boost of an amount which is the inverse of the gain droop experienced by the RF amplifier (22). The amount of gain boost is determined by generating a heat signal (88) from low-pass filtering (86) the squared magnitude (82) of a communication signal (14). The heat signal (88) is scaled by a weighting signal (68) estimated by monitoring the amplified RF signal (42) at the output of the RF amplifier (22). A nonlinear relationship section (96) then transforms the scaled signal into a gain-boost signal (94) that corresponds to the inverse of gain droop in the RF amplifier (22).

24 Claims, 5 Drawing Sheets

U.S. PATENT DOCUMENTS

2006/0091949 A1     5/2006     Smithson
2007/0018722 A1     1/2007     Jaenecke

OTHER PUBLICATIONS

H.Q. He and M. Faulkner, Performance of Adaptive Predistortion with Temperature, Fifth International Symposium on Signal Processing and its Applications, ISSPA '99, Brisbane, Australia, Aug. 22-25, 1999.

E. Schurack, et al., Analysis and Measurements of Nonlinear Effects in Power Amplifiers Caused by Thermal Power Feedback, Journal Article, Federal Armed Forces University Munich, 1992 IEEE.

J.S. Kenney and P. Fedorenko, Identification of RF Power Amplifier Memory Effect Origins using Third-Order Intermodulation Distortion Amplitude and Phase Asymmetry, Journal Article, School of Electrical and Computer Engineering, Atlanta, Georgia, 2006 IEEE.

O. Tornblad, et al., Modeling and Measurements of Electrical and Thermal Memory Effects for RF Power LDMOS, Journal Article, 2007 IEEE.

Ding et al., "A Memory Polynomial Predistorter Implemented Using TMS320C67XX", (Proceedings of Texas Instruments Developer Conference), Feb. 2004, pp. 1-7, Texas, USA.

Hammi et al., "On the Effects of the Average Power of Training Sequences Used to Synthesize Memory Digital Predistorters in WCDMA Transmitters", (© 2007 EuMA Proceedings of the 37th European Microwave Conference), Oct. 2007, pp. 174-177, Munich, Germany.

He et al., "Performance of Adaptive Predistortion With Temperature in RF Power Amplifier Linearization", (Fifth International Symposium on Signal Processing and its Applications), Aug. 1999, pp. 717-720, Brisbane, Australia.

Liu et al., "Deembedding Static Nonlinearities and Accurately Identifying and Modeling Memory Effects in Wide-Band RF Transmitters", (IEEE Transactions on Microwave Theory and Techniques), Nov. 2005, pp. 3578-3587, vol. 53, No. 11, Canada.

Morgan et al., "A Generalized Memory Polynomial Model for Digital Predistortion of RF Power Amplifiers", (IEEE Transactions on Signal Processing), Oct. 2006, pp. 3852-3860, vol. 54, No. 10, Canada.

Paasschens et al., "Dependence of Thermal Resistance on Ambient and Actual Temperature", (Proceedings of the 2004 Meeting on Bipolar Bicmos Circuits & Technology), Sep. 2004, pp. 96-99, The Netherlands.

Schurack et al., "Analysis and Measurement of Nonlinear Effects in Power Amplifiers Caused by Thermal Power Feedback", (IEEE International Symposium on Circuits and Systems), May 1992, pp. 758-761, Munich, Germany.

Tornblad et al., "Modeling and Measurements of Electrical and Thermal Memory Effects for RF Power LDMOS", (IEEE/MTT-S International Microwave Symposium), Jun. 2007, pp. 2015-2018, USA.

Yong-Sheng et al., "Research of Electro-Thermal Memory Effect of RF Power Amplifier based on LDMOS EFT", (4th Asia-Pacific Conference on Environmental Electromagnetics), Aug. 2006, CEEM'2006/Dalian 4A2-09, pp. 787-791, China.

Zhu et al., "An Overview of Volterra Series Based Behavioral Modeling of RF/Microwave Power Amplifiers", (RF & Microwave Research Group University College Dublin © 2006 IEEE), pp. 1-5, Ireland.

* cited by examiner

RF TRANSMITTER WITH HEAT COMPENSATION AND METHOD THEREFOR

TECHNICAL FIELD OF THE INVENTION

The present invention relates generally to the field of radio-frequency (RF) transmitters. More specifically, the present invention relates to circuits and techniques of RF transmitters that linearize, compensate, and otherwise improve upon the less than perfectly linear response characteristics of RF amplifiers.

BACKGROUND OF THE INVENTION

Linearity refers to the ability of an RF amplifier portion of an RF transmitter to amplify without distortion. Desirably, distortion is held to a minimum and RF amplifiers are as linear as possible so that the RF transmitter will broadcast the intended signal, confined within the intended spectral band, and refrain from interfering in other spectral bands.

Unfortunately, typical RF transmitters are teeming with causes for the distortion that invariably appears to some degree in the signals generated by RF amplifiers. For example, the transfer curve of the RF amplifier itself may simply fail to be linear over the entire signal range. In-band distortion may result from imbalances between quadrature components of complex signals being processed. Bias feed networks may provide varying bias signals or otherwise interact with a signal to be amplified in a manner that alters the spectral characteristics of the signal. And, predistorters which attempt to introduce a canceling distortion prior to amplification in an RF amplifier often use corrupted feedback signals derived from an output of the RF amplifier in order to determine what sort of canceling distortion should be introduced. All these sources of distortion operate in concert with one another causing the joint effect to be difficult to adequately address.

Thermal effects represent yet another cause for the distortion that appears in signals generated by RF amplifiers. Thermal effects refer to the distortion resulting from operating the RF amplifier at different temperatures. Thus, if an RF transmitter is perfectly configured to minimize distortion when its RF amplifier operates at one temperature, as soon as the RF amplifier operates at a different temperature, the RF transmitter will no longer be perfectly configured to minimize distortion.

Thermal effects operate in concert with other causes of distortion, but differ from the other causes in that they become evident over an entirely different time scale. Most of the other causes of distortion produce their full distorting effect within the short span of time required for a communication signal to propagate through the RF transmitter, if not instantly. Often, a significant consequence of the other distorting effects is spectral corruption of the amplified signal, such as the generation of unwanted intermodulation products and spectral regrowth. The spectral corruption is often mitigated by spectrally processing the communication signal, but the wider the bandwidth of the communication signal, the more difficult the spectral processing task becomes.

Thermal effects produce their distorting consequences more slowly. While spectral corruption may also result from thermal effects, the spectral corruption may be a more indirect result. For example, an RF amplifier may heat up as the RF amplifier amplifies a greater magnitude signal. But the heating occurs gradually and in proportion to the total energy consumed over a longer period of time rather than to any particular instantaneous signal power level. The heating typically influences an RF amplifier by causing the RF amplifier to exhibit a gain variation versus higher temperatures.

Conventional techniques for linearizing RF amplifiers have addressed thermal effects. But conventional techniques typically attempt to compensate for thermal effects using techniques or extensions of techniques that also compensate for the more instantaneous causes of distortion. These techniques can interact to each other's detriment. The result of using techniques or approaches to reduce thermal effects that are commonly used to reduce other causes of distortion is that conventional RF transmitters tend to produce excessive amounts of distortion.

SUMMARY OF THE INVENTION

It is an advantage of at least one embodiment of the present invention that an improved radio-frequency (RF) transmitter with heat compensation and method therefor are provided.

Another advantage of at least one embodiment of the present invention is that a heat compensator is dedicated to compensating thermal effects in an RF amplifier.

Another advantage of at least one embodiment of the present invention is that a heat compensator is provided that refrains from introducing spectral influences while a predistorter that introduces spectral influences is also provided.

Another advantage of at least one embodiment of the present invention is that a predistorter is provided to address the more instantaneous, spectrally related causes of distortion in an amplified signal while a heat compensator is provided to address thermal effects.

These and other advantages are realized in one form by an RF transmitter having an RF amplifier compensated for gain-droop distortion caused by heating in the RF amplifier. The RF transmitter includes a source of a communication signal. A variable amplification section having an input coupled to the communication-signal source is also provided. The variable amplification section has an output coupled to the RF amplifier. A low-pass filter has an input coupled to the communication-signal source and is configured to generate a heat signal corresponding to heating in the RF amplifier. A gain-transformation section couples to the low-pass filter and to the variable amplification section. The gain-transformation section is configured to generate a gain-boost signal in response to the heat signal, where the gain-boost signal corresponds to an inverse of the gain-droop in the RF amplifier.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION OF THE PREFERRED EMBODIMENTS

Figure 1:
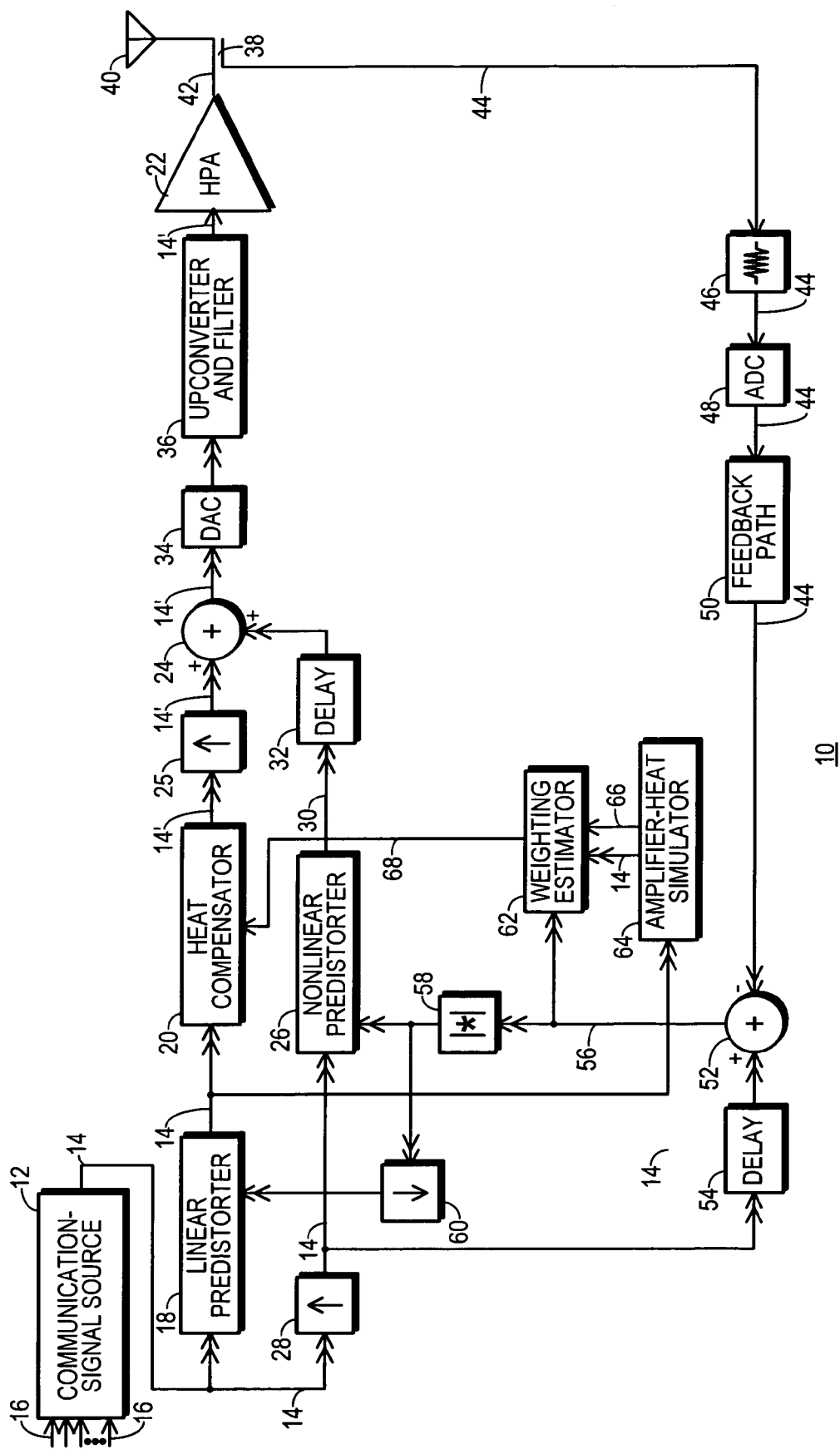
FIG. 1 shows a block diagram of one embodiment of an RF transmitter configured in accordance with the teaching of the present invention.

FIG. 1 shows a block diagram of a radio-frequency (RF) transmitter 10 configured in accordance with the teaching of one embodiment of the present invention. RF transmitter 10 includes a communication-signal source 12. Communication-signal source 12 provides a digitally modulated, complex, baseband version of a communication signal, referred to below as communication signal 14.

Communication-signal source 12 may perform any number of activities well known to those skilled in the art of digital RF transmitters. For example, raw data to be transmitted from RF transmitter 10 may be digitally modulated using a suitable form of digital modulation, such as QPSK, CDMA, OFDM, or the like. Multiple data streams 16 may have been digitally modulated and combined together for transmission, as occurs in a cellular base station. The digitally modulated signal may have been pulse-shaped to limit bandwidth while minimizing intersymbol interference (ISI). Additional processing may have been performed to reduce the peak-to-average power ratio. Any or all of these and other types of signal processing activities may be performed at communication-signal source 12. As a result of the processing performed at communication-signal source 12, communication signal 14 is a baseband, digitally modulated, complex signal that exhibits a bandwidth roughly equal to the bandwidth allocated to RF transmitter 10 for the transmission of RF energy. This bandwidth resides at baseband (i.e., near DC). Desirably, communication signal 14 is an analytic signal having a bandwidth centered at or near 0 Hz. In one embodiment, communication signal 14 is a wideband multi-channel signal, having a bandwidth of around 20 MHz, but this particular bandwidth is not a requirement of the present invention. The figures symbolize the complex nature of communication signal 14 and of other complex signals within RF transmitter 10 using a double-arrowhead notation.

Communication signal 14 drives a linear predistorter 18, where it is spectrally processed to introduce in-band predistortion (i.e., distortion within the bandwidth of communication signal 14). As a result of the spectral processing in linear predistorter 18, the relative amplitudes of different frequencies within the bandwidth of communication signal 14 are changed when compared to communication signal 14 upstream of linear predistorter 18.

An output of linear predistorter 18 couples to an input of a heat compensator 20 and provides a predistorted version of communication signal 14 to heat compensator 20. Heat compensator 20 compensates for gain-droop distortion caused by heating in an RF amplifier 22 of RF transmitter 10. Heat compensator 20 introduces substantially no spectral alteration of the communication signal it processes. In other words, the relative amplitudes of different frequencies within the bandwidth of communication signal 14 are substantially unchanged when compared to communication signal 14 upstream of heat compensator 20. Heat compensator 20 generates a boosted-gain communication signal 14', and boosted-gain communication signal 14' is supplied to a first input of a combining circuit 24 through an up-sampler 25. Up-sampler 25 increases the sample rate and may be implemented using an interpolator. Heat compensator 20 is discussed in more detail below in connection with FIGS. 3-4.

Communication signal 14 from communication-signal source 12 also drives a nonlinear predistorter 26 after being rate-shifted in an up-sampler 28. Nonlinear predistorter 26 spectrally processes communication signal 14 to introduce out-of-band (i.e., outside the bandwidth of communication signal 14) predistortion. In one embodiment, nonlinear predistorter 26 generates a plurality of higher-order basis functions in response to communication signal 14. The basis functions are functionally related to communication signal 14 in a nonlinear way. For example, one basis function may be roughly proportional to I*M(I), and another basis function may be roughly proportional to I*M(I)*M(I), where "I" represents the input signal (e.g., communication signal 14) and "M(I)" represents the magnitude of the input signal. In this embodiment, nonlinear predistorter 26 desirably equalizes the basis functions through independent adaptive equalizers (not shown), then combines the equalized basis functions into a nonlinear predistortion signal 30.

Nonlinear predistortion signal 30 is delayed through a delay element 32, then applied to a second input of combining circuit 24 to insert nonlinear distortion into boosted-gain communication signal 14'. Delay element 32 is configured to temporally align nonlinear predistortion signal 30 with boosted-gain communication signal 14'. In other words, delay element 32 is configured so that a sample of communication signal 14 processed through linear predistorter 18 and a sample of communication signal 14 processed through nonlinear predistorter 26 arrive at combining circuit 24 at the same time.

Combining circuit 24 combines the nonlinear distortion of nonlinear predistortion signal 30 into boosted-gain communication signal 14', and boosted-gain communication signal 14' then propagates toward a digital-to-analog converter (DAC) 34. DAC 34 converts boosted-gain communication signal 14' into an analog signal, which drives an upconverter and filter block 36. Block 36 frequency shifts communication signal 14', now in analog form, to the allocated frequency band for RF transmitter 10 and filters the frequency-shifted signal to pass only a desired sideband. Block 36 produces an RF form of communication signal 14'. Boosted-gain communication signal 14', now in RF form, is then fed to an input of RF amplifier 22, which is also referred to as a high power amplifier (HPA) 22.

In the embodiment depicted in FIG. 1, an output of RF amplifier 22 couples through a directional coupler 38 to an antenna 40. RF amplifier 22 amplifies the RF form of communication signal 14' to produce an amplified RF signal 42. Desirably, the linear and nonlinear predistortion respectively introduced upstream through the operations of linear predistorter 18 and nonlinear predistorter 26 and the gain predistortion introduced upstream through the operation of heat compensator 20 are of the correct character and composition to cancel distortions introduced downstream of DAC 34, and amplified RF signal 42 is a linear amplification of communication signal 14 provided by communication-signal source 12, only in analog form and shifted in frequency to the allocated frequency band for RF transmitter 10.

In order for the upstream predistortions to be of the correct character and composition to cancel distortions introduced downstream of DAC 34 it is desirable that RF signal 42 be monitored and that the upstream predistortions be responsive to RF signal 42. Accordingly, a tap-off port of directional coupler 38 extracts a small portion of amplified RF signal 42 for use as a feedback signal 44. Feedback signal 44 is routed through an attenuator 46 and an analog-to-digital converter (ADC) 48, where it is then presented to a feedback path 50. Attenuator 46 operates in conjunction with directional coupler 38 to apply about the same amount of attenuation as is experienced in gain through RF amplifier 22. ADC 48 desirably operates at high speed and is phase coherent with the upconversion of block 36 so as to perform downconversion by digital subharmonic sampling. This form of downconversion is desirable because it lessens the corruption of feedback signal 44 than might occur if downconversion is performed through a more analog-intensive form of downconversion.

Feedback path 50 performs digital processing on feedback signal 44. In particular, feedback path 50 desirably includes a Hilbert transformation to place feedback signal 44 in a complex, analytic signal form. And, feedback path 50 may include a phase rotation to compensate for phase rotation introduced downstream of DAC 34, primarily in a band-pass filter portion of block 36. Eventually, feedback signal 44, now in digital complex form, is supplied to a first input of a subtraction circuit 52.

Communication signal 14 from the output of up-sampler 28 is presented through a delay element 54 to a second input of subtraction circuit 52. Delay element 54 is configured to temporally align communication signal 14 with feedback signal 44 at subtraction circuit 52. In other words, delay element 54 is configured so that a sample of communication signal 14 processed through up-sampler 28 and delay element 54 and a sample of communication signal 14 processed through RF amplifier 22 and feedback path 50 arrive at subtraction circuit 52 at the same time. An output of subtraction circuit 52 generates an error signal 56 which describes the manner in which amplified RF signal 42 fails to be a linear amplification of communication signal 14.

Error signal 56 is processed through a conjugation circuit 58 and presented to a control input of nonlinear predistorter 26. The conjugated version of error signal 56 is also presented to a control input of linear predistorter 18 through a downsampler 60, which may be implemented by a decimator.

In one embodiment, linear predistorter 18 is implemented using an adaptive equalizer that adjusts equalizer coefficients in response to a least-means square (LMS) based estimation-and-convergence algorithm. The adaptive equalizer of linear predistorter 18 desirably estimates equalizer coefficient values that will influence the amount of linear distortion in amplified RF signal 42, then alters these coefficients over time to adjust the predistortion transformation function applied by the adaptive equalizer and to achieve decreasing amounts of linear distortion until convergence is reached at a minimum amount of linear distortion. The estimation-and-convergence algorithm trains linear predistorter 18 to reduce linear distortion in response to correlation between the conjugated form of error signal 56 and a version of communication signal 14 from communication-signal source 12 that has been delayed into temporal alignment with the conjugated form of error signal 56. Through error signal 56, linear predistorter 18 is driven by and responsive to amplified RF signal 42.

Likewise, in one embodiment nonlinear predistorter 26 includes two or more adaptive equalizers that adjust equalizer coefficients in response to least-means square (LMS) based estimation-and-convergence algorithms. The estimation-and-convergence algorithms train each adaptive equalizer in nonlinear predistorter 26 to reduce nonlinear distortion in response to correlation between the conjugated form of error signal 56 and a version of the basis function being equalized that has been delayed into temporal alignment with the conjugated form of error signal 56. Through error signal 56, linear predistorter 18 is driven by and responsive to amplified RF signal 42.

Those skilled in the art may devise other forms of linear and nonlinear predistorters. For example, predistorters implemented through the use of look-up tables may be used as well.

Error signal 56 is also supplied to a first input of a weighting estimator 62, and communication signal 14, preferably obtained from the output of linear predistorter 18, is also supplied to an input of an amplifier-heat simulator 64. This version of communication signal 14 is routed through amplifier-heat simulator 64 and from a first output of amplifier-heat simulator 64 to a second input of weighting estimator 62. Amplifier-heat simulator 64 also generates a simulated heat signal 66 at a second output that couples to a third input of weighting estimator 62. Simulated heat signal 66 simulates the self-heating taking place in RF amplifier 22 in response to the amplification processing taking place therein.

An output of weighting estimator 62 couples to a control input of heat compensator 20. Weighting estimator 62 produces a weighting signal 68. Weighting signal 68 is responsive to both simulated heat signal 66 and amplified RF signal 42. Weighting signal 68 operates as a coefficient or scale factor for a heat signal, similar to simulated heat signal 66, generated in heat compensator 20, as is discussed in more detail below in connection with FIGS. 3-5.

Figure 2:
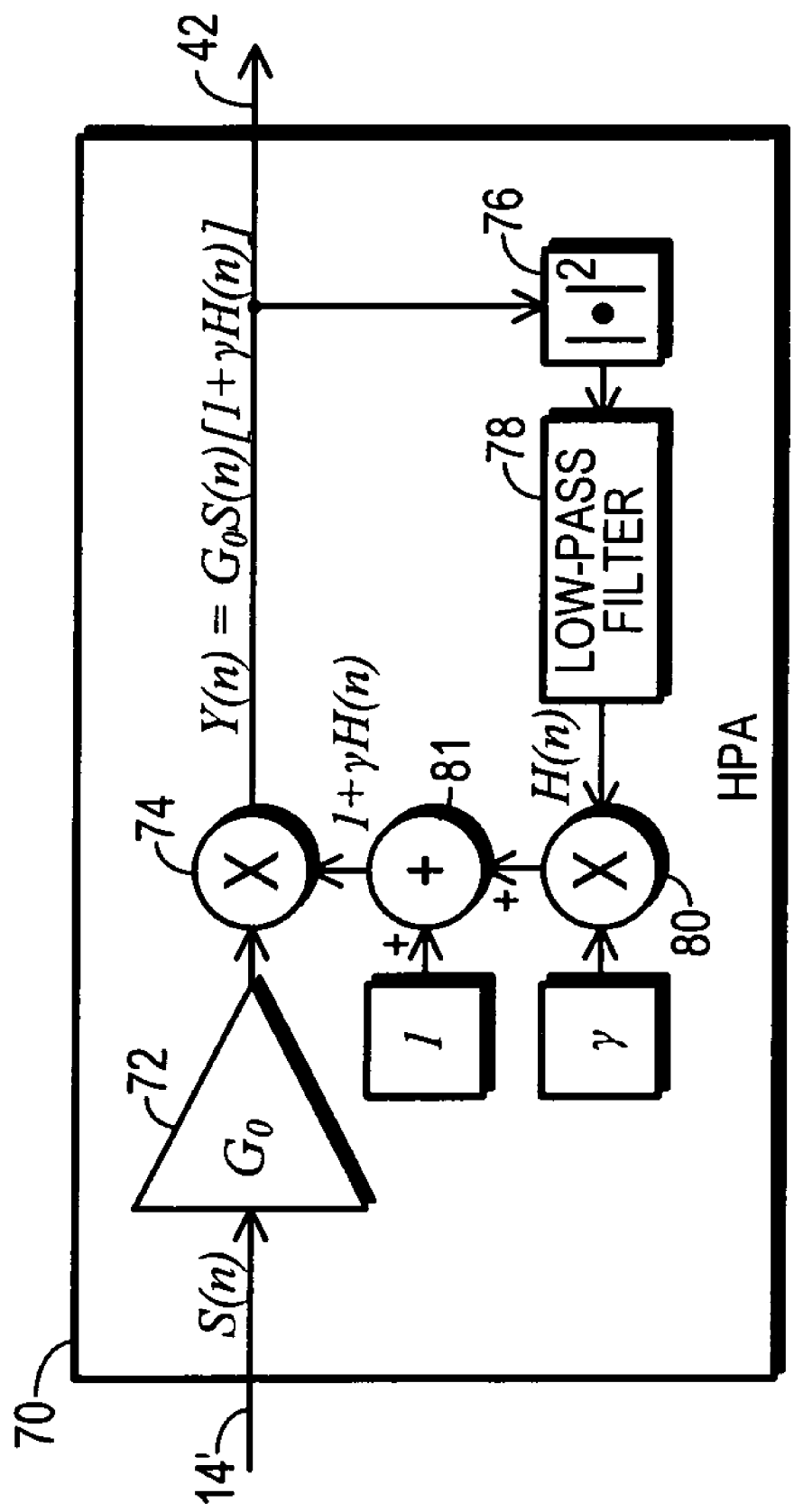
FIG. 2 shows a block diagram of a model of an RF amplifier configured to provide an explanation for the way in which heat influences an RF amplifier portion of the RF transmitter depicted in FIG. 1.

FIG. 2 shows a block diagram of a model 70 of RF amplifier 22 (FIG. 1) configured to provide an explanation for the way in which thermal effects influence the operation of RF amplifier 22. Those skilled in the art will appreciate that RF amplifier 22 is constructed from real components and materials that fail to operate precisely as desired. Accordingly, models, such as model 70, may be devised to explain the manner in which RF amplifier 22 actually appears to operate. The specific components of model 70 need not be observable in a real world version of RF amplifier 22.

Referring to FIGS. 1 and 2, model 70 receives an RF form of boosted-gain communication signal 14' [S(n)] at an input. A gain stage 72 [$G_O$] perfectly amplifies this input signal. In other words, gain stage 72 represents an ideal amplifier, and gain $G_O$ is the ideal gain desired for RF amplifier 22. An output of gain stage 72 drives a first input of a multiplier 74, and an output of multiplier 74 generates amplified RF signal 42.

Amplified RF signal 42 also drives a signal-squaring section 76, which provides an output responsive to the square of the magnitude of amplified RF signal 42. Signal-squaring section 76 indicates that self-heating in RF amplifier 22 is responsive to the power of the signal output from RF amplifier 22. An output of signal-squaring section 76 drives a low-pass filter 78.

Low-pass filter 78 establishes a thermal time constant that relates the appearance of power at the output of RF amplifier 22 to the gain-droop distortion caused by the self-heating brought about by the appearance of the power. The specific characteristics of filter 78 will vary with the make and model of RF amplifier 22. But two different thermal time constants appear to exert an influence. One thermal time constant reflects the heating of the semiconductor die which forms the operating portion of RF amplifier 22. Another thermal time constant reflects the heating of the packaging to which and/or in which the die is mounted. The die time constant is typically shorter than the package time constant. For a typical LDMOS RF amplifier that might be used in a cellular base station application, die and package time constants on the order of 90 µs and 370 µs, respectively, are representative.

In order to model a realistic RF amplifier, filter 78 desirably models two poles, with each pole corresponding to a filter band corner frequency that is much less than, preferably less than 0.05 times and more preferably less than 0.01 times, the bandwidth of communication signal 14. The two poles desirably correspond as closely as possible to the actual thermal time constants for the die and package used by RF amplifier 22. These values may be determined for each make and model of RF amplifier 22 through empirical observations.

The use of two poles in low-pass filter 78, with each pole corresponding to a corner frequency much less than the bandwidth of communication signal 14, has a desirable attribute in addition to matching the apparent performance of a real world RF amplifier 22. By being much less than the bandwidth of low-pass filter 78, the direct spectral influence of self-heating on the performance of RF amplifier 22 is very small and likely to be confined in-band.

Low-pass filter 78 generates a heat signal [H(n)] that is scaled in a multiplier 80 by a weighting coefficient [γ]. The scaling of the heat signal [H(n)] by the weighting coefficient [γ] signifies the amount by which the heat signal [H(n)], produced by filtering the power of the amplifier's output signal, corresponds to actual self-heating in RF amplifier 22. The weighting coefficient [γ] should exhibit a negative value for an LDMOS RF amplifier 22 because thermal effects cause LDMOS amplifier gain to droop. But those skilled in the art will appreciate that the use of an LDMOS RF amplifier 22 is not a requirement of the present invention and that other types of RF amplifiers 22 may exhibit positive values for the weighting coefficient [γ]. In addition, those skilled in the art will appreciate that terms, such as "gain" and "droop" are used herein as relative terms that can exhibit either positive or negative values. Thus, some types of RF amplifiers 22, such as bipolar transistor RF amplifiers, may exhibit a negative gain droop, and heat compensator 20 may then apply a negative gain boost to compensate. The scaled signal from multiplier 80 is summed with unity ("1") in a summer 81, and the result routed to a second input of multiplier 74. The value of unity is added because at zero power output, no heat influence should be present, and the output of gain stage 72 should not be attenuated by multiplier 74. In other words, the gain of gain stage 72 should be unchanged in the absence of any appreciable thermal effect. Accordingly, the output of RF amplifier 22 may be expressed as follows to reflect the influence of self-heating:

$$Y(n)=G_0 S(n)[1+\gamma H(n)] \quad \text{EQ. 1}$$

Those skilled in the art will appreciate that the model of FIG. 2 is configured only to characterize the influence of self-heating. A more complete model may reflect other considerations. For example, gain for high instantaneous-amplitude portions of a signal may also droop immediately due to a less than perfectly linear transfer curve. And, bias influences may also be reflected in a model. The more complete model is not presented here because it is unnecessary to an understanding of the heat compensation provided in accordance with the embodiment of the present invention described herein.

Referring to FIGS. 1 and 2, heat compensator 20 applies a gain boost that is the inverse of the gain droop characterized by multiplier 74 in model 70. Amplifier-heat simulator 64 generates a real world signal 66 which simulates the heat signal [H(n)] from low-pass filter 78 in model 70 divided by the gain-squared $[G_0^2]$ of RF amplifier 22. And, weighting estimator 62 generates an estimate of weighting coefficient [γ] times the gain-squared $[G_0^2]$ of RF amplifier 22 using simulated heat signal 66 and amplified RF signal 42.

Model 70 omits characterizing the influence of the ambient temperature. The ambient temperature also influences the temperature experienced by RF amplifier 22. But the ambient temperature tends to change more slowly than the self-heating which is the subject of model 70. Since weighting estimator 62 monitors amplified RF signal 42 and continuously updates an estimate of the weighting coefficient $[G_0^2 \gamma]$ to reflect the current conditions in the preferred embodiment, weighting signal 68 output by weighting estimator 62 tracks the ambient temperature and is responsive to changes in the ambient temperature.

Figure 3:
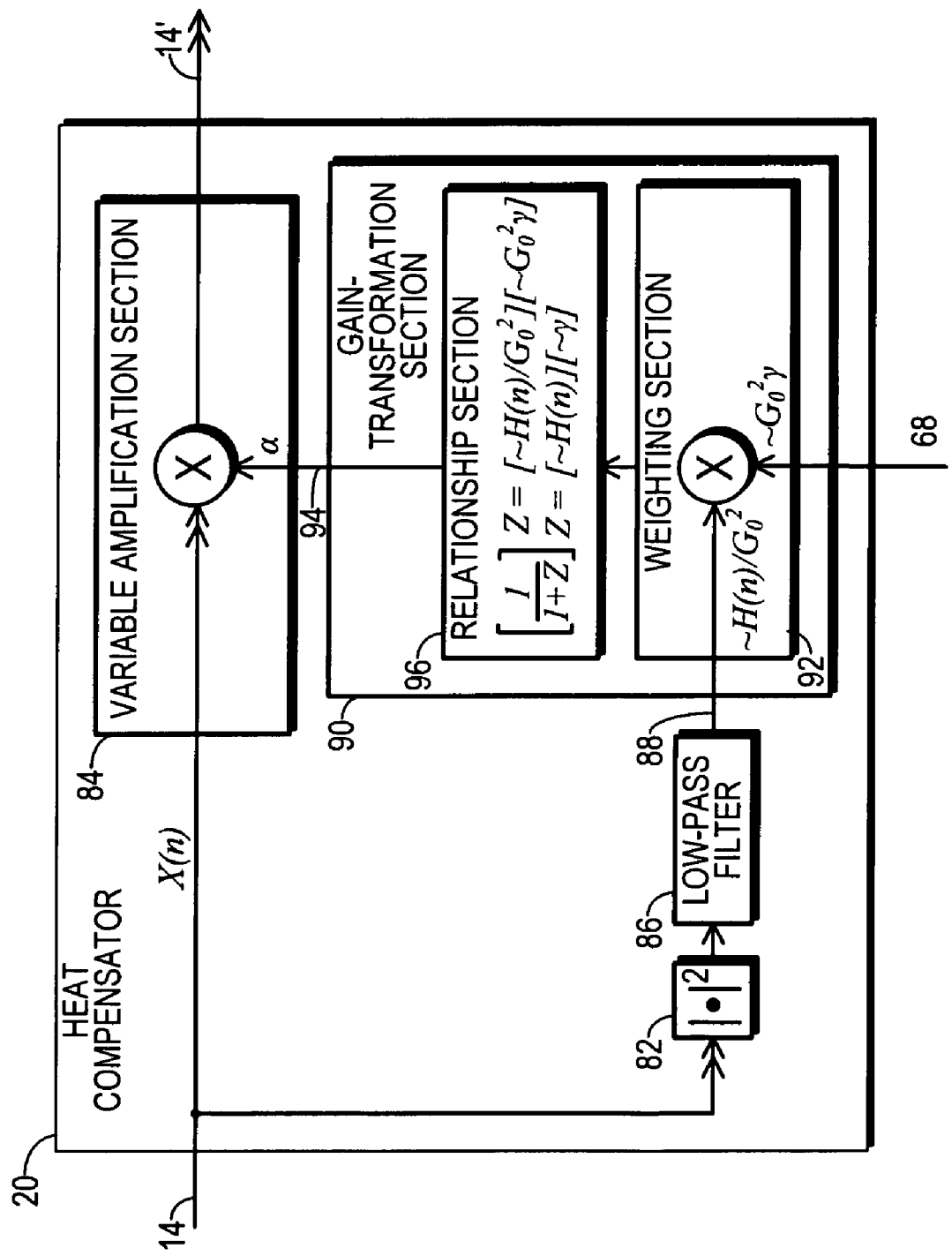
FIG. 3 shows a block diagram of one embodiment of a heat compensator portion of the RF transmitter depicted in FIG. 1.

FIG. 3 shows a block diagram of one embodiment of heat compensator 20. A first version of communication signal 14 is routed to an input of a signal-squaring section 82 and a second version of communication signal 14 is routed to an input of a variable amplification section 84. An output of signal-squaring section 82 couples to an input of a low-pass filter 86. Signal-squaring section 82 and low-pass filter 86 mirror signal-squaring section 76 and low-pass filter 78 from model 70 (FIG. 2). Desirably, low-pass filter 86 exhibits two poles, which each pole corresponding to a filter band corner frequency that is much less than, preferably less than 0.05 times and more preferably less than 0.01 times, the bandwidth of communication signal 14. The two poles desirably correspond as closely as possible to the actual thermal time constants for the die and package used by RF amplifier 22. Accordingly, low-pass filter 86 generates a heat signal 88 that corresponds to self-heating in RF amplifier 22. Heat signal 88 is responsive to the square of the magnitude of communication signal 14. But heat signal 88 reflects a heat value that is $1/G_0^2$ times the actual heat signal [H(t)] experienced in RF amplifier 22. The difference is due to the heat [H(t)] in RF amplifier 22 being produced after the gain $[G_0]$ of RF amplifier 22 has been applied to the communication signal.

Heat signal 88 is routed to a gain-transformation section 90, and particularly to a weighting section 92 of gain-transformation section 90. Gain-transformation section 90 generates a gain-boost signal 94 in response to heat signal 88 and weighting signal 68. Gain-boost signal 94 is supplied to variable amplification section 84. Variable amplification section 84 may be configured as a multiplier, with communication signal 14 [X(n)] supplied to one input and gain-boost signal 94 [α] supplied to another. The output of this multiplier and of variable amplification section 84 serves as the output from heat compensator 20. Ignoring the small impact on heating contributed by nonlinear predistortion applied at combining circuit 24, then:

$$S(n)=\alpha X(n), \quad \text{EQ. 2}$$

where S(n) represents the input to RF amplifier 22 (FIG. 2) and α represents gain-boost signal 94, the output of gain-transformation section 90. Since the goal of variable amplifier section 84 and of heat compensator 20 is to provide a gain boost which is the inverse of the gain droop introduced by multiplier 74 (FIG. 2), then:

$$Y(n)=G_0 X(n). \quad \text{EQ. 3}$$

Accordingly, $$\alpha = \frac{1}{1+[\sim H(n)/G_0^2][\sim G_0^2 \gamma]} \quad \text{EQ. 4}$$

where, $$\sim H(n)=X^2(n)F(t) \quad \text{EQ. 5}$$

and where ~H(n) represents an estimation of H(n) in model 70 (FIG. 2) but at an amplitude of $1/G_0^2$ times the actual heat signal H(t) experienced in RF amplifier 22, F(t) represents the transfer function of low pass filter 86 and of modeled low-pass filter 78 (FIG. 2), and $\sim G_0^2 \gamma$ is provided by weighting signal 68. $\sim G_0^2\gamma$ reflects an estimation of both $G_0$ and $\gamma$ in model 70 (FIG. 2), discussed in more detail below in connection with FIG. 5. Weighting section 92 multiplies or scales heat signal 88 [$\sim H(n)$] by weighting signal 68 [$\sim G_0^2\gamma$] to characterize an amount by which heat signal 88 corresponds to heating in RF amplifier 22.

As depicted in FIG. 3, gain-transformation section 90 also includes a relationship section 96 which receives an output from weighting section 92 and which characterizes a manner in which heat signal 88 corresponds to self-heating in RF amplifier 22. In one embodiment, that manner and relationship is in the form of:

$$\alpha = \frac{1}{1+Z} \qquad \text{EQ. 6}$$

where $$Z=[\sim H(n)/G_0^2][\sim G_0^2\gamma]=H(n)\sim\gamma \qquad \text{EQ. 7}$$

Those skilled in the art will appreciate that the $\alpha$ relationship may be easily implemented in discrete circuits. But in an alternate embodiment, the relationship of relationship section 96 may also be implemented using a look-up table or in any other way known to those of skill in the art.

Figure 4:
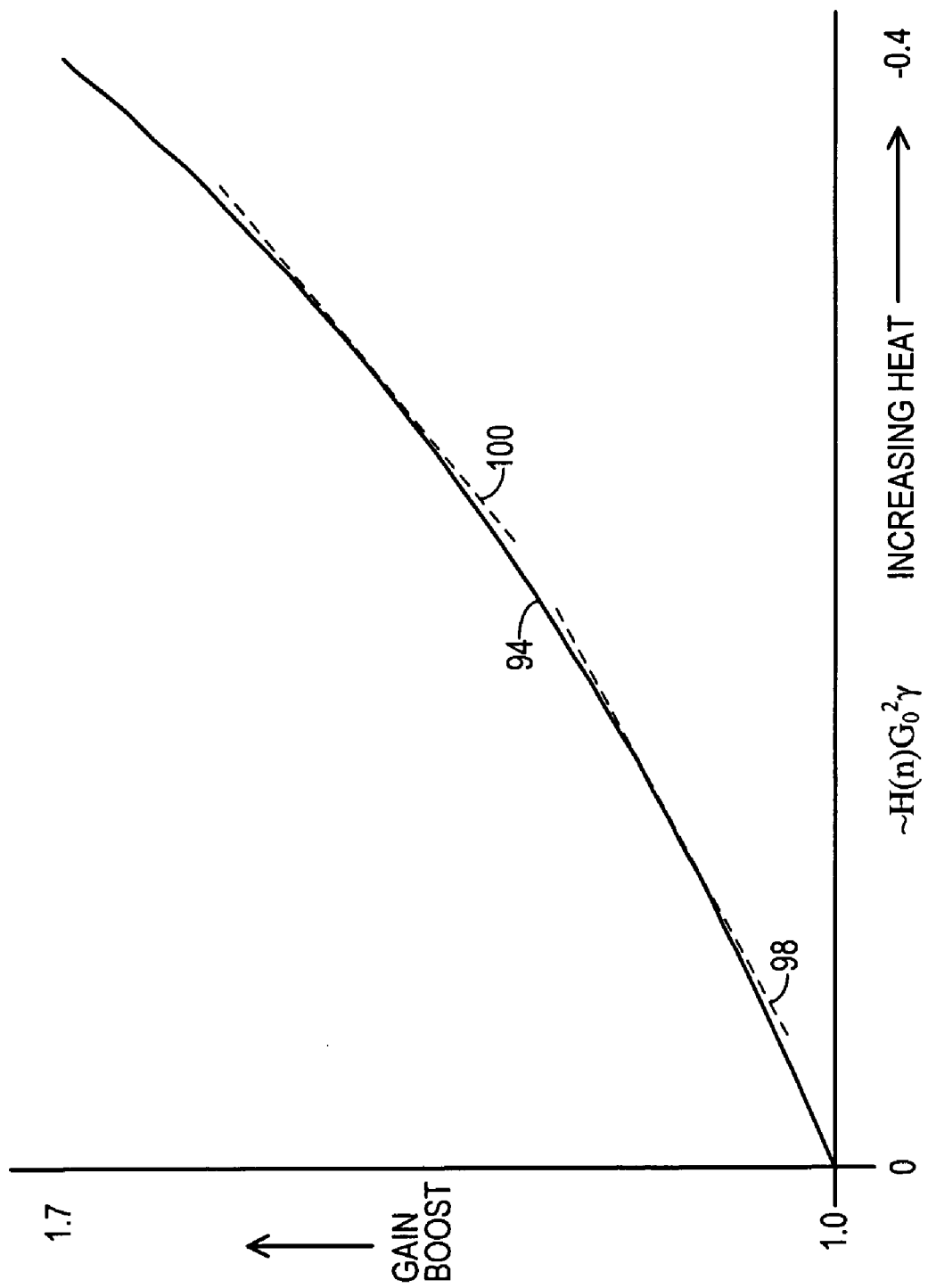
FIG. 4 graphically shows an exemplary transfer function implemented by a gain-transformation section of the heat compensator depicted in FIG. 3.

FIG. 4 graphically shows an exemplary transfer function implemented by relationship section 96. In particular, relationship section 96 establishes a nonlinear relationship between gain-boost signal 94 and heat signal 88, even when weighting signal 68 remains constant. As RF amplifier 22 experiences increasing self-heating and increasing temperatures, a greater amount of gain boost is reflected in boosted-gain communication signal 14'. More specifically, gain-boost signal 94 increases at an increasing rate as heat signal 88 characterizes increased heating in RF amplifier 22, as signified in FIG. 4 by tangential dotted line 98 exhibiting a lower slope at a lower level of heat and by tangential dotted line 100 exhibiting a higher slope at a higher level of heat.

Through the relationship established in relationship section 96, variable amplification section 84 compensates for the type of gain-droop distortion that is caused by heating in RF amplifier 22. Variable amplification section 84 performs substantially no spectral processing on communication signal 14. But by compensating for gain-droop distortion in RF amplifier 22, spectral distortion improves, and other components of RF transmitter 10, such as predistorters 18 and 26, can better address remaining spectral distortions.

Figure 5:
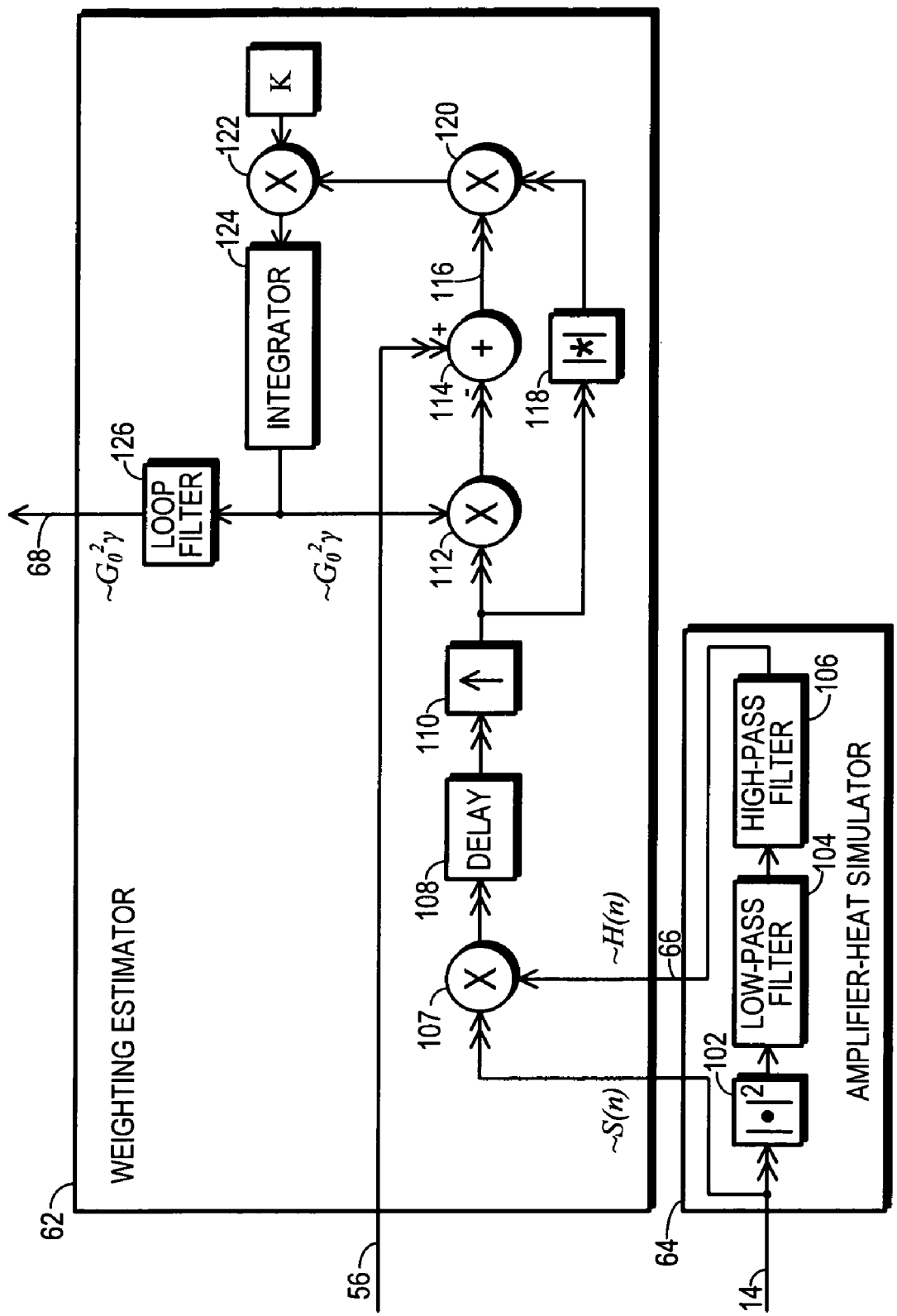
FIG. 5 shows a block diagram of one embodiment of an amplifier-heat simulator portion and of a weighting estimator portion of the RF transmitter depicted in FIG. 1.

FIG. 5 shows a block diagram of one embodiment of amplifier-heat simulator 64 and of weighting estimator 62. Amplifier-heat simulator 64 includes a signal-squaring section 102 with an input that receives communication signal 14. In the preferred embodiment, the version of communication signal 14 routed to the input of amplifier-heat simulator 64 is obtained from the output of linear predistorter 18, but in an alternate embodiment the version of communication signal 14 from communication-signal source 12 may be used. An output of signal-squaring section 102 couples to a low-pass filter 104. Desirably, low-pass filter 104 is configured substantially the same as low-pass filter 86 in heat compensator 20 (FIG. 3). An output of low-pass filter 104 couples to an input of a high-pass filter 106, and an output of high-pass filter 106 serves as the output of amplifier-heat simulator 64. In an alternate embodiment, filters 104 and 106 may be combined into a single band-pass filter. Amplifier-heat simulator 64 generates a simulated heat signal 66 [$\sim H(n)/G_0^2$] to match the heat signal [$H(n)$] times $1/G_0^2$ from model 70 (FIG. 2) as closely as practical.

Linear predistorter 18 operates within a feedback loop that responds to amplified RF signal 42 generated at the output of RF amplifier 22. Accordingly, when RF amplifier 22 experiences self-heating, the effect of that self-heating is exhibited in amplified RF signal 42, and linear predistorter 18 may respond accordingly. In particular, when linear predistorter 18 is implemented using an adaptive equalizer, the adaptive equalizer's filter coefficients may change in response to the self-heating of RF amplifier 22. Thus, to some degree linear predistorter 18 may act as an automatic gain control circuit and boost gain in response to self-heating. In order to form an accurate simulated heat signal 66 [$\sim H(n)/G_0^2$], amplifier-heat simulator 64 desirably compensates for this response. In the embodiment depicted in FIG. 5, that compensation is provided by high-pass filter 106, which has a corner frequency substantially the same as the loop bandwidth of the feedback loop that controls adaptation in linear predistorter 18. Thus, high-pass filter 106 diminishes the simulated heat signal 66 by roughly the amount that it may have been boosted through the operation of linear predistorter 18.

Those skilled in the art may devise other forms of compensation for the response of linear predistorter to self-heating in RF amplifier 22. For example, adaptation in linear predistorter 18 may be frozen while amplifier-heat simulator 64 and weighting estimator 62 resolve a weighting coefficient, and vice-versa.

Weighting estimator 62 receives error signal 56 at an input. Referring briefly to EQ. 1 above and to FIG. 1, attenuator 46 effectively divides amplified RF signal 42 [$Y(n)$] by the gain [$G_0$], and subtraction circuit 52 essentially subtracts an estimate of the communication signal [$S(n)$]. As a result, error signal 56 [$E(n)$] is roughly in the following form:

$$E(n) \sim \gamma H(n) S(n) \qquad \text{EQ. 8}$$

Simulated heat signal 66 [$\sim H(n)/G_0^2$] provides an estimate of $H(n)$ times $1/G_0^2$ to weighting estimator 62, and an estimate [$\sim S(n)$] of the communication signal [$S(n)$] is provided by communication signal 14 routed through amplifier-heat simulator 64. Accordingly, weighting estimator implements a tracking estimation loop to derive an estimate of the weighting coefficient [$\sim G_0^2\gamma$] from error signal 56 [$E(n)$], simulated heat signal 66 [$\sim H(n)/G_0^2$], and communication signal 14 [$\sim S(n)$].

Simulated heat signal 66 [$\sim H(n)/G_0^2$] and communication signal 14 [$\sim S(n)$] are multiplied together in a multiplier 107, and the resulting product delayed in a delay element 108. After a rate conversion in an up-sampler 110 and scaling by the current estimated weighting coefficient [$\sim G_0^2\gamma$] in a multiplier 112, an error signal estimate based on the current estimated weighting coefficient [$\sim G_0^2\gamma$] is compared with the actual error signal 56 [$E(n)$] in a subtraction circuit 114. The actual error signal 56 [$E(n)$] reflects the true weighting coefficient [$\gamma$] and true heat value [$H(n)$] rather than mere gain-squared adjusted estimates thereof. Delay element 108 is configured to temporally align communication signal 14 propagating through multiplier 107 and delay element 108 with error signal 56 at subtraction circuit 114.

Subtraction circuit 114 produces a difference signal 116 that corresponds to the difference between the true and actual weighting coefficients. The product of simulated heat signal 66 [$\sim H(n)/G_0^2$] and communication signal 14 [$\sim S(n)$] is conjugated in a conjugation circuit 118, and the conjugated product multiplied by difference signal 116 in a multiplier 120.

The product output from multiplier 120 only equals zero when the estimated weighting coefficient $[\sim G_0^2\gamma]$ equals the actual weighting coefficient $[\gamma]$ times the squared gain $[G_0^2]$. The output from multiplier 120 is scaled by a suitable loop constant "K" in a multiplier 122, and the result integrated in an integrator 124. It is the output of integrator 124 that provides the current estimated weighting coefficient $[\sim G_0^2\gamma]$ and couples to an input of multiplier 112. And the difference between the estimated weighting coefficient $[\sim G_0^2\gamma]$ and the actual weighting coefficient $[\gamma]$ times the squared gain $[G_0^2]$ drives the estimated weighting coefficient $[\sim G_0^2\gamma]$ in a direction that converges on the actual weighting coefficient $[\gamma]$ times the actual square of the gain $[G_0^2]$. When the two are equal, the estimated weighting coefficient $[\sim G_0^2\gamma]$ is maintained.

FIG. 5 shows that the estimated weighting coefficient $[\sim G_0^2\gamma]$ is supplied through a loop filter 126 to produce weighting signal 68. Desirably, loop filter 126 is implemented as a proportional-plus-integral filter to track to and provide a more stable output. When changes in ambient temperature cause the actual weighting coefficient $[\gamma]$ to change, the estimation loop of weighting estimator 62 will track the change and update weighting signal 68 accordingly.

While FIG. 5 depicts one preferred weighting estimator 62, those skilled in the art will appreciate that alternates may provide suitable results in various applications. In one alternate embodiment, weighting estimator 62 may simply provide a constant value suitable for the make and model of RF amplifier 22 being used in RF transmitter 10. In another alternate embodiment, weighting estimator 62 may be provided by a look-up table addressed by a signal responsive to ambient temperature, where the table stores different weighting coefficients suitable for the make and model of RF amplifier 22 being used in RF transmitter 10 operating at different temperatures.

In summary, the present invention provides an improved RF transmitter with heat compensation and method therefor. In at least one embodiment of the present invention, a heat compensator is dedicated to compensating thermal effects in an RF amplifier, allowing other components such as a predistorter to better respond to other causes of RF amplifier distortion.

Although the preferred embodiments of the invention have been illustrated and described in detail, it will be readily apparent to those skilled in the art that various modifications may be made therein without departing from the spirit of the invention or from the scope of the appended claims. For example, the location of heat compensator 20 may be varied from application to application from that shown and described herein. Heat compensator 20 may alternately be located upstream of predistorters, or downstream of the location described herein. In one alternate embodiment, heat compensator 20 may be located downstream of digital-to-analog conversion and implemented using analog components. These and other modifications and adaptations which are obvious to those skilled in the art are to be included within the scope of the present invention.

What is claimed is:

1. An RF transmitter having an RF amplifier compensated for gain-droop distortion caused by self-heating in said RF amplifier, said RF transmitter comprising:
   a source of a communication signal;
   a variable amplification section having an input coupled to said communication-signal source, said variable amplification section having an output coupled to said RF amplifier;
   a low-pass filter having an input coupled to said communication-signal source and configured to generate a heat signal and to exhibit a time constant that relates RF amplifier power to gain-droop distortion caused by said self-heating in said RF amplifier; and
   a gain-transformation section coupled to said low-pass filter and said variable amplification section and configured to generate a gain-boost signal in response to said heat signal, said gain-boost signal corresponding to an inverse of said gain-droop in said RF amplifier.

2. An RF transmitter as claimed in claim 1 additionally comprising a predistorter having a first input coupled to said communication-signal source, a second input coupled to an output of said RF amplifier, and an output coupled to one of said variable amplification section and said RF amplifier.

3. An RF transmitter as claimed in claim 1 wherein:
   said communication signal exhibits a bandwidth;
   said low-pass filter is configured to exhibit at least two poles; and
   each of said at least two poles corresponds to a corner frequency of less than 0.05 times said bandwidth.

4. An RF transmitter as claimed in claim 1 additionally comprising a signal-squaring section coupled to said low-pass filter so that said heat signal is responsive to the square of the magnitude of said communication signal.

5. An RF transmitter as claimed in claim 1 wherein said gain-transformation section comprises:
   a weighting section which characterizes an amount by which said heat signal corresponds to said heating in said RF amplifier; and
   a relationship section which characterizes a manner in which said heat signal corresponds to said heating in said RF amplifier.

6. An RF transmitter as claimed in claim 1 wherein said gain-transformation section is configured to establish a nonlinear relationship between said gain-boost signal and said heat signal.

7. An RF transmitter as claimed in claim 1 wherein said variable amplification section is configured to impart substantially no spectral alteration to said communication signal.

8. An RF transmitter as claimed in claim 1 additionally comprising a weighting estimator having an output coupled to one of said low-pass filter and said gain-transformation section and having an input coupled to an output of said RF amplifier, said weighting estimator being configured to produce a weighting signal in response to a signal generated at said output of said RF amplifier, wherein said weighting signal scales said heat signal to correspond to said heating in said RF amplifier.

9. An RF transmitter as claimed in claim 8 wherein:
   said weighting estimator includes an input adapted to receive a signal which simulates said heating in said RF amplifier; and
   said weighting estimator is configured so that said weighting signal is responsive to said signal which simulates said heating in said RF amplifier.

10. An RF transmitter as claimed in claim 9 wherein:
    said RF transmitter additionally comprises an amplifier-heat simulator coupled to said weighting estimator and configured to generate a signal which simulates said heating in said RF amplifier;
    said weighting estimator is configured so that said weighting signal is responsive to said signal which simulates said heating in said RF amplifier; and
    said RF transmitter additionally comprises a predistorter adapted to respond to said signal generated at said output of said RF amplifier, and said predistorter is responsive to said heating in said RF amplifier;

wherein said amplifier-heat simulator is configured to compensate for said response of said predistorter to said heating in said RF amplifier.

11. A method of operating an RF transmitter to compensate for gain-droop distortion in an RF amplifier, said gain-droop distortion being caused by self-heating in said RF amplifier, said method comprising:

filtering a first communication signal to generate a heat signal, said heat signal exhibiting a time constant that relates RF amplifier power to gain-droop distortion caused by said self-heating in said RF amplifier;

transforming said heat signal into a gain-boost signal which corresponds to an inverse of said gain-droop in said RF amplifier;

amplifying a second communication signal which corresponds to said first communication signal in response to said gain-boost signal to generate a boosted-gain communication signal; and feeding said boosted-gain communication signal to an input of said RF amplifier.

12. A method as claimed in claim 11 wherein:

said second communication signal exhibits a bandwidth; and said filtering activity is performed by a filter having at least two poles, wherein each of said at least two poles corresponds to a corner frequency of less than 0.05 times said bandwidth.

13. A method as claimed in claim 11 wherein said filtering activity is configured so that said heat signal is responsive to the square of the magnitude of said second modulated communication signal.

14. A method as claimed in claim 11 wherein said transforming establishes a nonlinear relationship between said gain-boost signal and said heat signal.

15. A method as claimed in claim 11 wherein:

said method additionally comprises producing a weighting signal in response to a signal generated at said output of said RF amplifier, wherein said weighting signal scales said heat signal to correspond to said heating in said RF amplifier; and said transforming activity is responsive to said weighting signal.

16. An RF transmitter as claimed in claim 15 wherein:

said method additionally comprises generating a signal which simulates said heating in said RF amplifier; and said producing activity is responsive to said signal which simulates said heating in said RF amplifier.

17. An RF transmitter having an RF amplifier compensated for gain-droop distortion caused by self-heating in said RF amplifier, said RF transmitter comprising:

a source of a communication signal;

a variable amplification section having an input responsive to said communication signal, said variable amplification section generating a boosted-gain communication signal which drives said RF amplifier;

a low-pass filter having an input responsive to said communication signal and configured to generate a heat signal and to exhibit a time constant that relates RF amplifier power to gain-droop distortion caused by said self-heating in said RF amplifier;

a weighting estimator having an input responsive to a signal generated at said output of said RF amplifier, said weighting estimator being configured to produce a weighting signal which scales said heat signal to correspond to said heating in said RF amplifier; and a gain-transformation section configured to generate a gain-boost signal in response to said heat signal, said gain-boost signal corresponding to an inverse of said gain-droop in said RF amplifier, and said gain-boost signal being supplied to said variable amplification section.

18. An RF transmitter as claimed in claim 17 additionally comprising a predistorter having a first input responsive to said communication signal, a second input responsive to said signal generated at said output of said RF amplifier, and an output which generates a predistorted communication signal that drives at least one of said variable amplification section and said RF amplifier.

19. An RF transmitter as claimed in claim 17 wherein said weighting estimator is configured so that said weighting signal is responsive to changes in ambient temperature.

20. An RF transmitter as claimed in claim 17 wherein said transformation section is configured so that said gain-boost signal increases at an increasing rate as said heat signal characterizes increased heating in said RF amplifier.

21. An RF transmitter having an RF amplifier compensated for gain-droop distortion, said RF transmitter comprising:

a source of a communication signal;

a section having an input coupled to said source and configured to raise the magnitude of said communication signal to a power;

a low-pass filter having an input coupled to said section which raises the magnitude of said communication signal to a power and an output which provides a signal that simulates a characteristic of amplification processing taking place in said RF amplifier;

a multiplier having a first input coupled to said communication signal source, a second input adapted to receive said signal which simulates a characteristic of amplification processing, and having an output; and a compensator having a first input coupled to said communication signal source a second input coupled to said output of said multiplier, said compensator having an output coupled to said RF amplifier.

22. An RF transmitter as claimed in claim 21 wherein said power is two, causing said section to be a signal-squaring section.

23. An RF transmitter as claimed in claim 21 wherein said characteristic of amplification processing taking place in RF amplifier is self-heating.

24. An RF transmitter as claimed in claim 21 wherein said compensator is a heat compensator.

* * * * *